(12) United States Patent
Verma et al.

(10) Patent No.: US 11,929,213 B2
(45) Date of Patent: Mar. 12, 2024

(54) PARALLEL-CONNECTED TRENCH CAPACITOR STRUCTURE WITH MULTIPLE ELECTRODE LAYERS AND METHOD OF FABRICATING THE SAME

(71) Applicant: UNITED MICROELECTRONICS CORP., Hsin-Chu (TW)

(72) Inventors: Purakh Raj Verma, Singapore (SG); Ching-Yang Wen, Pingtung County (TW); Xingxing Chen, Singapore (SG); Chao Jin, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 302 days.

(21) Appl. No.: 16/854,887

(22) Filed: Apr. 21, 2020

(65) Prior Publication Data
US 2021/0313116 A1  Oct. 7, 2021

(30) Foreign Application Priority Data
Apr. 1, 2020  (CN) ........................ 202010248852.8

(51) Int. Cl.
*H01G 4/38* (2006.01)
*H01G 4/008* (2006.01)
(Continued)

(52) U.S. Cl.
CPC ............. *H01G 4/385* (2013.01); *H01G 4/008* (2013.01); *H01L 21/2885* (2013.01);
(Continued)

(58) Field of Classification Search
CPC ........ H01G 4/385; H01G 4/008; H01G 4/012; H01G 4/33; H01L 21/2885;
(Continued)

(56) References Cited

U.S. PATENT DOCUMENTS 5,976,928 A * 11/1999 Kirlin .................... H01L 28/55
257/E21.651
6,278,153 B1 * 8/2001 Kikuchi .................. H01L 28/55
257/532
(Continued)

FOREIGN PATENT DOCUMENTS

CN  101005066 A   7/2007
CN  102272904 A  12/2011
(Continued)

*Primary Examiner* — David M Sinclair
*Assistant Examiner* — Daniel M Dubuisson
(74) *Attorney, Agent, or Firm* — Winston Hsu (57) ABSTRACT

A structure of capacitors connected in parallel includes a substrate. A trench embedded in the substrate. Numerous electrode layers respectively conformally fill in and cover the trench. The electrode layers are formed of numerous nth electrode layers, wherein n is a positive integer from 1 to M, and M is not less than 3. The nth electrode layer with smaller n is closer to the sidewall of the trench. When n equals to M, the Mth electrode layer fills in the center of the trench, and the top surface of the Mth electrode is aligned with the top surface of the substrate. A capacitor dielectric layer is disposed between the adjacent electrode layers. A first conductive plug contacts the nth electrode layer with odd-numbered n. A second conductive plug contacts the nth electrode layer with even-numbered n.

9 Claims, 7 Drawing Sheets

(51) Int. Cl.
  *H01L 21/288*   (2006.01)
  *H01L 21/321*   (2006.01)
  *H01L 23/522*   (2006.01)
  *H01L 23/528*   (2006.01)
  *H01L 27/01*    (2006.01)
  *H01L 49/02*    (2006.01)

(52) U.S. Cl.
  CPC ...... *H01L 21/3212* (2013.01); *H01L 23/5226* (2013.01); *H01L 23/528* (2013.01); *H01L 27/01* (2013.01); *H01L 28/75* (2013.01); *H01L 28/91* (2013.01)

(58) Field of Classification Search
  CPC ............. H01L 21/3212; H01L 23/5226; H01L 23/528; H01L 27/01; H01L 28/75; H01L 28/91; H01L 28/90
  See application file for complete search history.

(56) References Cited

U.S. PATENT DOCUMENTS

| | | | |
|---|---|---|---|
| 6,338,999 B1 | 1/2002 | Hsue | |
| 6,794,262 B2 | 9/2004 | Ning | |
| 7,300,840 B2 | 11/2007 | Lin | |
| 7,332,764 B2 | 2/2008 | Choi | |
| 2001/0054769 A1 | 12/2001 | Raaijmakers | |
| 2002/0030216 A1* | 3/2002 | Adkisson | H01L 28/75 257/E21.396 |
| 2002/0102835 A1 | 8/2002 | Stucchi | |
| 2006/0001174 A1* | 1/2006 | Matsui | H01L 25/0657 257/E23.079 |
| 2007/0152258 A1* | 7/2007 | Kim | H01L 23/5223 257/E21.011 |
| 2009/0244808 A1* | 10/2009 | Ohtsuka | H01G 4/06 361/311 |
| 2010/0178747 A1* | 7/2010 | Ellul | H01L 21/6835 438/386 |
| 2011/0210426 A1* | 9/2011 | Matsui | H01L 25/0657 257/E29.112 |
| 2012/0080771 A1 | 4/2012 | Yang | |
| 2013/0175666 A1* | 7/2013 | Tran | H01L 28/40 257/532 |
| 2013/0181326 A1* | 7/2013 | Cheng | H01L 28/91 438/387 |
| 2015/0206662 A1* | 7/2015 | Lamy | H01G 4/38 216/6 |
| 2017/0148869 A1 | 5/2017 | Detalle | |
| 2017/0352669 A1* | 12/2017 | Sharangpani | H10B 41/40 |
| 2018/0269276 A1* | 9/2018 | Lin | H01L 28/88 |
| 2018/0301371 A1 | 10/2018 | Wang | |
| 2018/0366537 A1* | 12/2018 | Liu | H01L 21/76879 |
| 2019/0385855 A1* | 12/2019 | Chien | H01L 29/66795 |
| 2021/0074630 A1 | 3/2021 | Eissa | |
| 2021/0305398 A1* | 9/2021 | Chang | H01L 27/11507 |

FOREIGN PATENT DOCUMENTS

| | | | |
|---|---|---|---|
| CN | 108028245 A | 5/2018 | |
| CN | 109103188 A | 12/2018 | |
| WO | WO-2011090440 A1 * | 7/2011 | ............. H01G 4/005 |

* cited by examiner

PARALLEL-CONNECTED TRENCH CAPACITOR STRUCTURE WITH MULTIPLE ELECTRODE LAYERS AND METHOD OF FABRICATING THE SAME

BACKGROUND OF THE INVENTION

1. Field of the Invention

The present invention relates to a capacitor structure and method of fabricating the same, and more particularly to a parallel-connected capacitor structure and method of fabricating the same.

2. Description of the Prior Art

Metal-Insulator-Metal (MIM) capacitors have been widely used in functional circuits, such as mixed signal circuits, analog circuits, radio frequency (RF) circuits, dynamic random access memory (DRAM), embedded dynamic random access memory (embedded DRAM) and logic operation circuit. Typically, an MIM capacitor includes an MIM capacitor dielectric located between a bottom electrode and a top electrode, the top electrode and the bottom electrode form electrodes of the MIM capacitor.

As a bandwidth is increased in the 5G generation, the number of antenna tuners must increase as well. Capacitors serving as components in antenna tuners therefore need to increase their number in a unit area. In order to increase the number of capacitors, conventional way usually increase the aspect ratio of the trench where the capacitors are disposed so as to increase the capacitance density in the same area and also increase the total surface area of the electrodes. However, the trench with larger aspect ratio is more difficult to etch. Moreover, an oblique angle often occurs at the edge of the trench with larger aspect ratio. In this case, after the capacitor is filled, the adjacent electrodes may be connected because of the oblique angle.

Therefore, it is necessary to provide a manufacturing method capable of improving the capacitance density to overcome the disadvantages and deficiencies in the conventional technology.

SUMMARY OF THE INVENTION

In view of this, the present invention provides a parallel-connected capacitor structure and a manufacturing method thereof, in particular, a manufacturing method capable of manufacturing a plurality of capacitor structures in a trench with a small aspect ratio.

According to a preferred embodiment of the present invention, a parallel-connected capacitor structure includes a substrate. A trench is embedded in the substrate, wherein an entirety of a sidewall of the trench is perpendicular to a top surface of the substrate. A plurality of electrode layers respectively conformally fill in and cover the trench, wherein the plurality of electrode layers are formed of a plurality of nth electrode layers, n is a positive integer from 1 to M, M is not less than 3, the nth electrode layer with smaller n in the plurality of nth electrode layers is closer to the sidewall of the trench, when n equals to M, an Mth electrode layer fills in a center of the trench, and a top surface of the Mth electrode layer is aligned with the top surface of the substrate. A capacitor dielectric layer is disposed between the plurality of electrode layers adjacent to each other. A first conductive plug contacts the nth electrode layer in the plurality of nth electrode layers with odd-numbered n. A second conductive plug contacts the nth electrode layer in the plurality of nth electrode layers with even-numbered n.

According to a preferred embodiment of the present invention, a fabricating method of a parallel-connected capacitor structure includes providing a substrate. Next, a trench is formed in the substrate, wherein an entirety of a sidewall of the trench is perpendicular to a top surface of the substrate. Later, a plurality of electroplating processes is performed to form a plurality of electrode layers filling in the trenches. The steps of forming the plurality of electrode layers include performing an nth electroplating process to form an nth electrode layer filling in and conformally covering the trench, wherein n is a positive integer from 1 to M, M is not less than 3, the nth electroplating process is performed from n equaling 1 to n equaling M, and an Mth electrode layer fills up a center of the trench. After each of the nth electroplating process, a capacitor dielectric layer is formed to cover the nth electrode layer. Then, a first conductive plug and a second conductive plug are formed. The first conductive plug contacts the nth electrode layer in the plurality of nth electrode layers with odd-numbered n, and the second conductive plug contacts the nth electrode layer in the plurality of nth electrode layers with even-numbered n.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 depict schematically a fabricating method of a parallel-connected capacitor structure according to a first preferred embodiment of the present invention, wherein:

DETAILED DESCRIPTION

FIG. 1 to FIG. 5 depict schematically a fabricating method of a parallel-connected capacitor structure according to a first preferred embodiment of the present invention. FIG. 3A depicts schematically a top view of FIG. 3 according a preferred embodiment of the present invention. FIG. 3B depicts schematically a top view of FIG. 3 according another preferred embodiment of the present invention.

Figure 1:
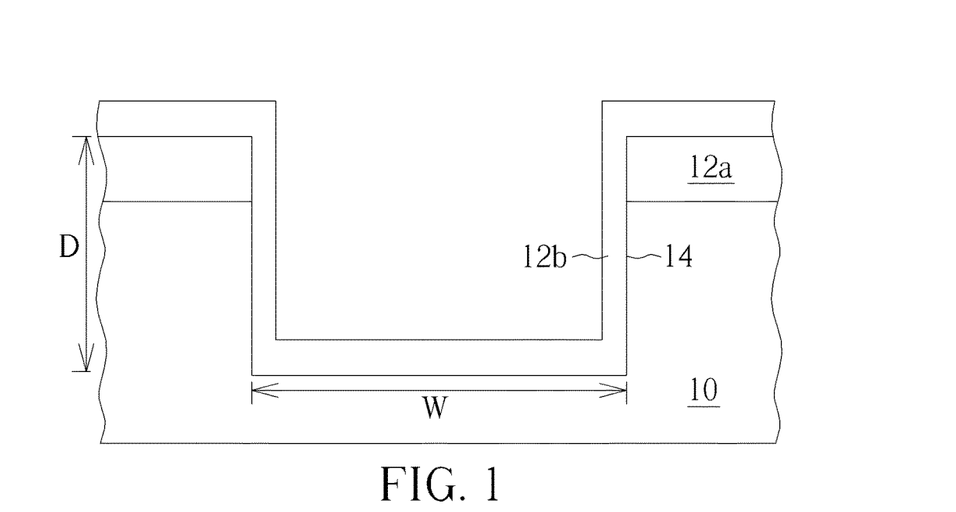
FIG. 1 shows a substrate with a trench therein.

As shown in FIG. 1, a substrate 10 is provided. The substrate 10 may be a silicon substrate, a germanium substrate, a gallium arsenide substrate, a silicon germanium substrate, an indium phosphide substrate, a gallium nitride substrate, a silicon carbide substrate, a silicon on insulator (SOI) substrate, a dielectric substrate or an integrated passive device (IPD) wafer. In the FIG. 1, the substrate 10 takes the silicon substrate as an example. Next, a dielectric layer 12a is formed to cover a top surface of the substrate 10. Then, the dielectric layer 12a and the substrate 10 are etched to form a trench 14 in the substrate 10. The trench 14 is preferably formed by a dry etching. The entire sidewall of the trench 14 is perpendicular to the top surface of the substrate 10. In other words, there is no step profile on the sidewall of the trench 14. Later, a dielectric layer 12b is formed to cover the dielectric layer 12a and conformally cover the top surface of the trench 14. The dielectric layer 12b is used to isolate the substrate 10 and a capacitor formed afterwards. If the substrate 10 is a dielectric substrate, the dielectric layer 12b can be omitted. It is noteworthy that the aspect ratio of the trench 14 is preferably between 2.5 and 30. The width W of the opening of the trench 14 is preferably between 1 μm and 4 μm. The depth D of the trench 14 is preferably between 1 μm and 30 μm. Conventionally, an opening of a conventional trench is usually 1.5 μm, and a depth of a conventional trench is 30 μm. Comparing to the conventional process, the width W of the trench 14 is larger; therefore, the trench 14 of the present invention can be formed more easily by a dry etching.

Figure 2:
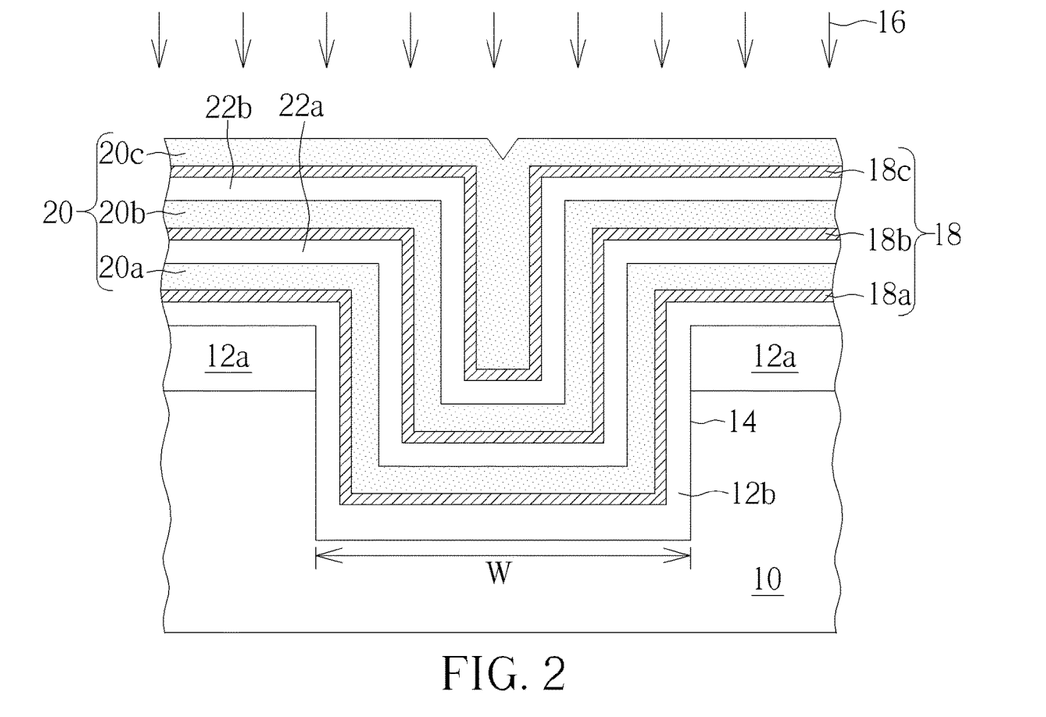
FIG. 2 is a fabricating stage following FIG. 1.

As shown in FIG. 2, numerous electroplating processes 16 are performed to form numerous electrode layers 20 fill in the trench 14 and cover the dielectric layer 12b. In details, the steps of forming the numerous electrode layers 20 includes performing an nth electroplating process to form an nth electrode layer fill in and conformally cover the trench 14 and the dielectric layer 12b, wherein n is a positive integer from 1 to M and M is not less than 3. The nth electroplating process is performed from n equaling 1 to n equaling M, and an Mth electrode layer fills up a center of the trench 14. Furthermore, before performing the nth electroplating process, a barrier 18 is formed. The barrier 18 includes tantalum nitride or titanium nitride.

Following description will take M equals 3 as an example to further explain the electroplating processes 16 in details.

Please still refer to FIG. 2, before performing the electroplating processes 16, a barrier 18a is formed to cover the dielectric layer 12a and conformally cover the trench 14. Later, a first electroplating process is performed to form a first electrode layer 20a filling in and conformally cover the trench 14 and the barrier 18a. Then, a capacitor dielectric layer 22a is formed to conformally cover the first electrode layer 20a. After that, a barrier 18b is formed to cover the capacitor dielectric layer 22a and conformally cover the trench 14. Subsequently, a second electroplating process is performed to form a second electrode layer 20b filling in and conformally cover the trench 14 and the barrier 18b. Next, a capacitor dielectric layer 22b is formed to conformally cover the second electrode layer 20b. After that, a barrier 18c is formed to cover the capacitor dielectric layer 22b and conformally cover the trench 14. Later, a third electroplating process is performed to form a third electrode layer 20c filling in and conformally cover the trench 14 and the barrier 18c. Now, the trench 14 is filled up by the dielectric layer 12b, the barriers 18a/18b/18c, the first electrode layer 20a, the second electrode layer 20b, the third electrode layer 20c and the capacitor dielectric layers 22a/22b.

The electroplating processes 16 are preferably copper electroplating processes. The reason why the electroplating processes 16 are used instead of using deposition processes for forming the electrode layers is because the electroplating processes 16 can offer more accurate control in the thickness of the electrode layers 20, and can provide better a coverage rate. In the case of forming electrode layers by deposition processes, the thickness of each of the electrode layers is hard to control, and the electrode layers can't conformally cover the trench 14.

Figure 3:
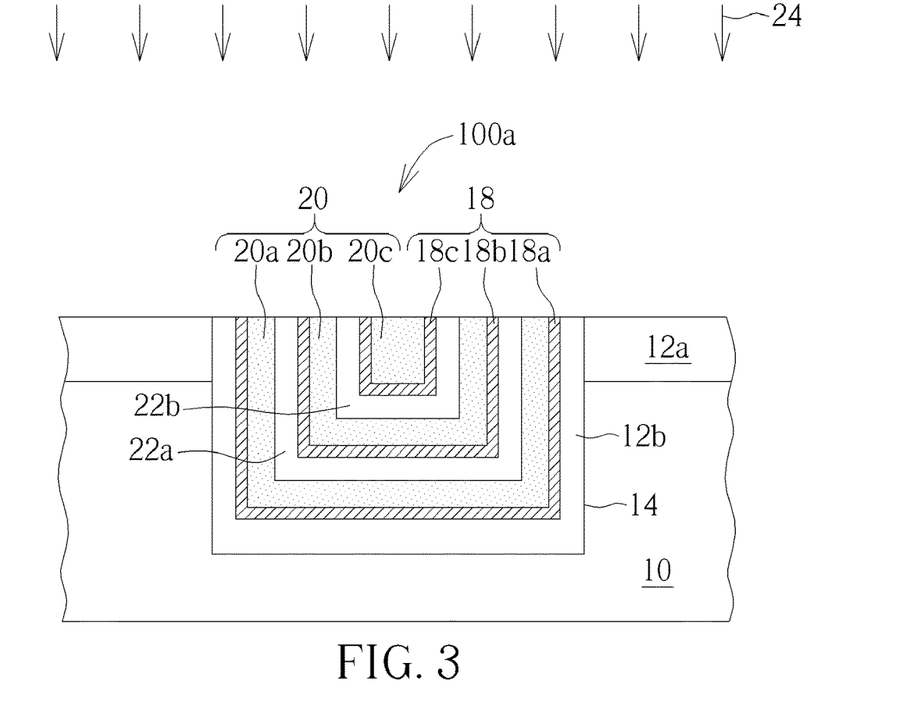
FIG. 3 is a fabricating stage following FIG. 2.
Figure 3A:
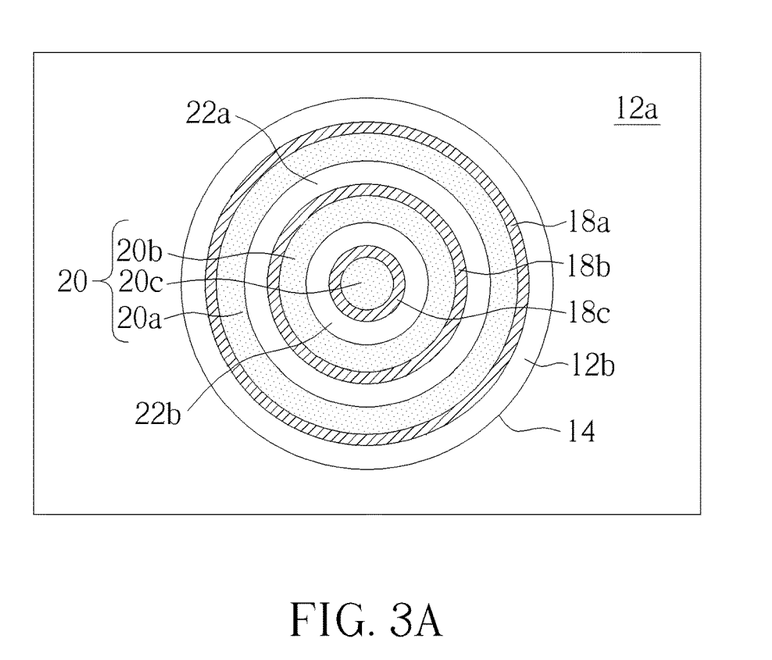
FIG. 3A depicts schematically a top view of FIG. 3 according a preferred embodiment of the present invention.
Figure 3B:
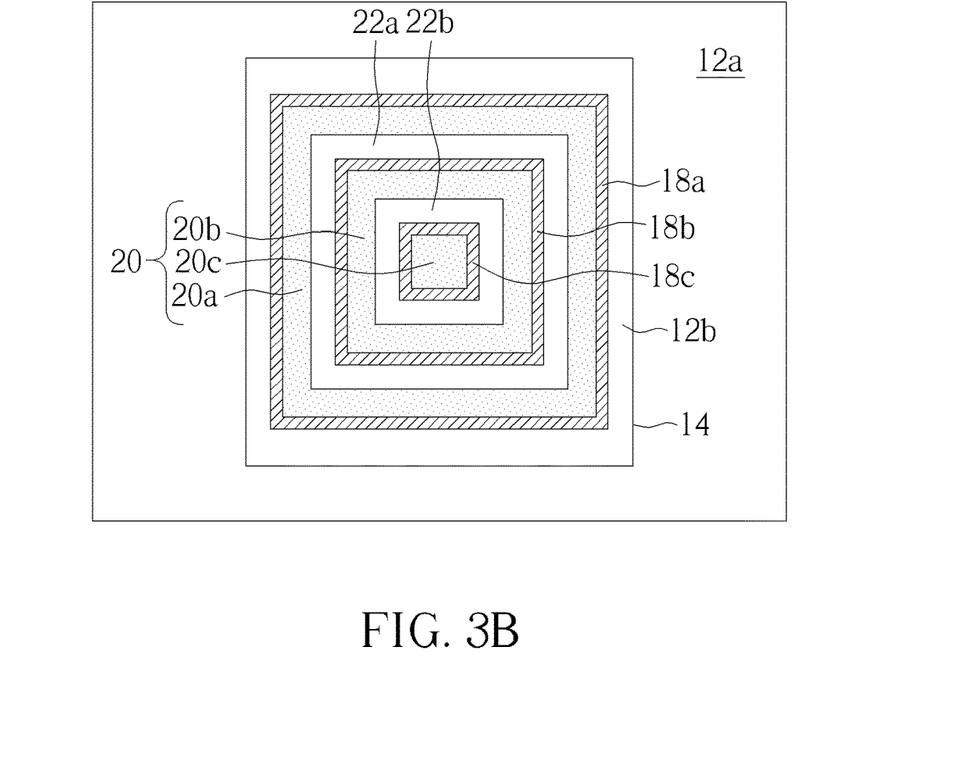
FIG. 3B depicts schematically a top view of FIG. 3 according another preferred embodiment of the present invention.

As shown in FIG. 3, a planarization process 24 is performed by taking the dielectric layer 12a as a stop layer to remove the dielectric layer 12b, the barriers 12a/18b/18c, the first electrode layer 20a, the second electrode layer 20b, the third electrode layer 20c and the capacitor dielectric layers 22a/22b outside of the trench 14. Now the barriers 12a/18b/18c, the first electrode layer 20a, the second electrode layer 20b, the third electrode layer 20c and the capacitor dielectric layers 22a/22b remained in the trench 14 form a capacitor structure 100a. In addition, the shape trench 14 of the present invention can be a cylinder or a quadrangular prism. Please refer to FIG. 3A. FIG. 3A shows a top view of the capacitor structure 100a when the trench 14 is in a shape of a cylinder. It is noteworthy that the first electrode layer 20a, the second electrode layer 20b and the third electrode layer 20c form concentric circles. The third electrode layer 20c fills up the center of the trench 14, and is a solid cylinder. FIG. 3B shows a top view of the capacitor structure 100a when the trench 14 is in a shape of a quadrangular prism. It is noteworthy that the first electrode layer 20a, the second electrode layer 20b and the third electrode 20c form concentric rectangle. The third electrode layer 20c fills up the center of the trench 14, and is a quadrangular prism.

Figure 4:
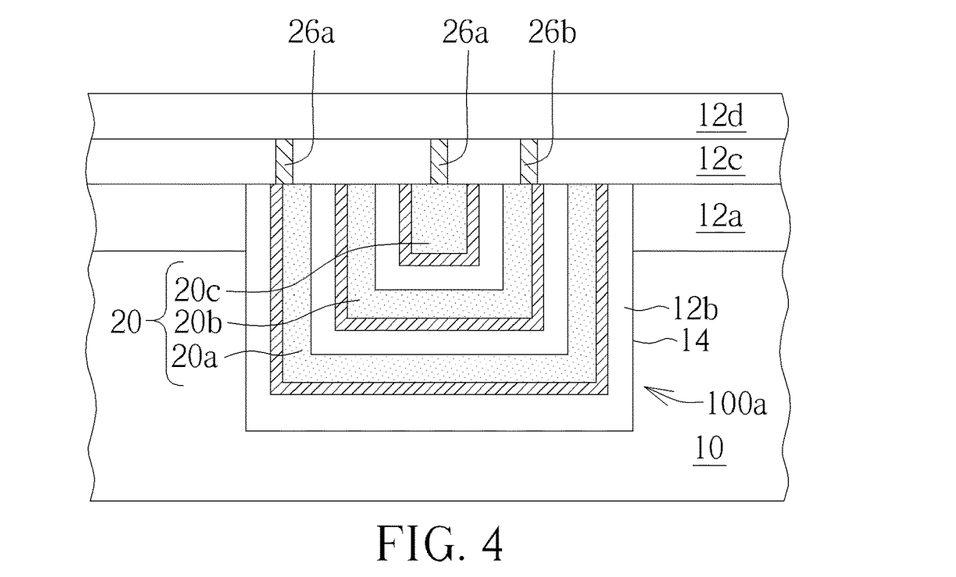
FIG. 4 is a fabricating stage following FIG. 3.

As shown in FIG. 4, a dielectric layer 12c is formed to cover the capacitor structure 100a. Then, two first conductive plugs 26a and a second conductive plug 26b are formed to penetrate the dielectric layer 12c. Two first conductive plugs 26a respectively contact the first electrode layer 20a and the third electrode layer 20c. The second electrode layer 20b contacts the second electrode layer 20b. Because the M equals 3 in this embodiment, the total number of the first conductive layer 26a and the second conductive layer 26b is 3. However, the total number of the first conductive layer 26a and the second conductive layer 26b varies as M changes. Basically, M equals to the total number of the first conductive layer 26a and the second conductive layer 26b. Later, a dielectric layer 12d is formed to cover the dielectric 12c.

Figure 5:
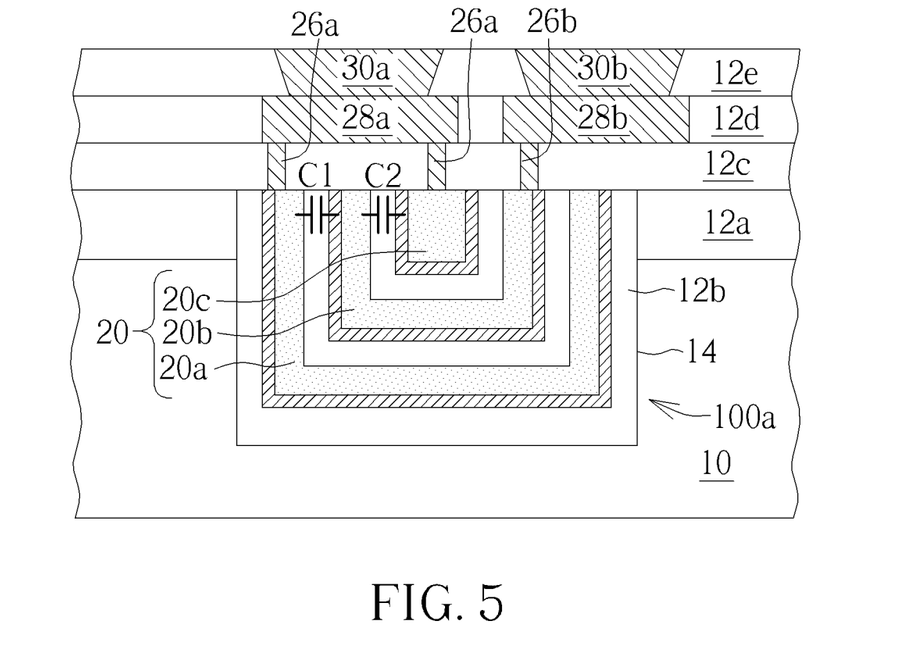
FIG. 5 is a fabricating stage following FIG. 4.

As shown in FIG. 5, a first conductive layer 28a is formed in the dielectric layer 12d to contact all the first conductive plugs 26a. A second conductive layer 28b is formed in the dielectric layer 12d to contact the second conductive plug 26b. Next, a dielectric layer 12e is formed. Subsequently, a first conductive terminal 30a and a second conductive terminal 30b are formed in the dielectric layer 12e. The first conductive terminal 30a contacts the first conductive layer 28a, and the second conductive terminal 30b contacts the second conductive layer 28b. The first conductive terminal 30a and the second conductive terminal 30b further electrically connect to other signal input/output devices. The dielectric layers 12a/12b/12c/12d/12e include silicon oxide, silicon nitride, borophosphosilicate glass (BPSG) or other materials of the interlayer dielectrics. Now, a parallel-connected capacitor structure 100a of the present invention is completed.

Figure 9:
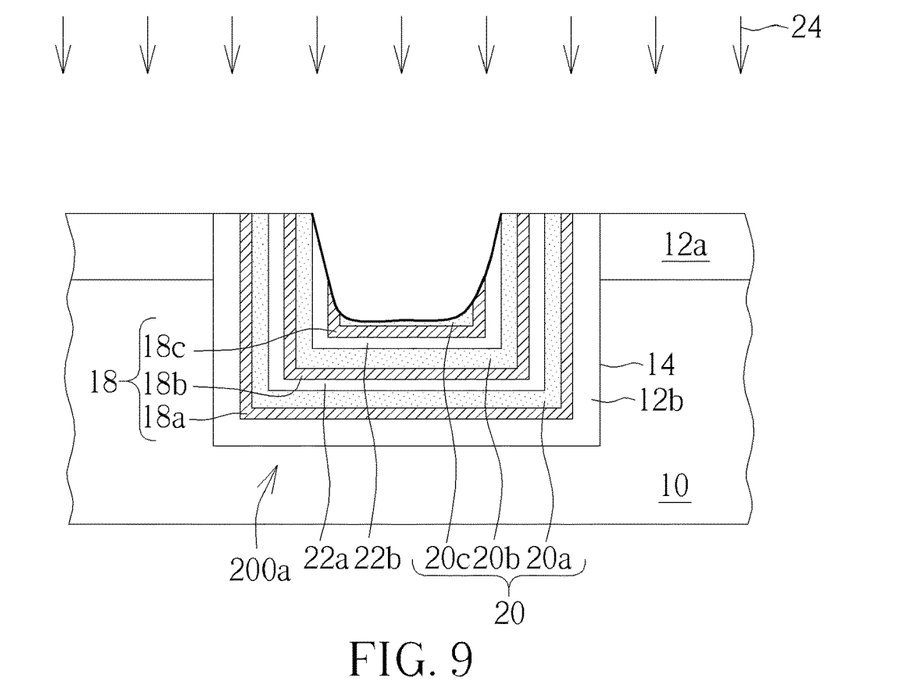
FIG. 9 to FIG. 10 schematically depict a fabricating method of a capacitor structure according to an example embodiment of the present invention.
Figure 10:
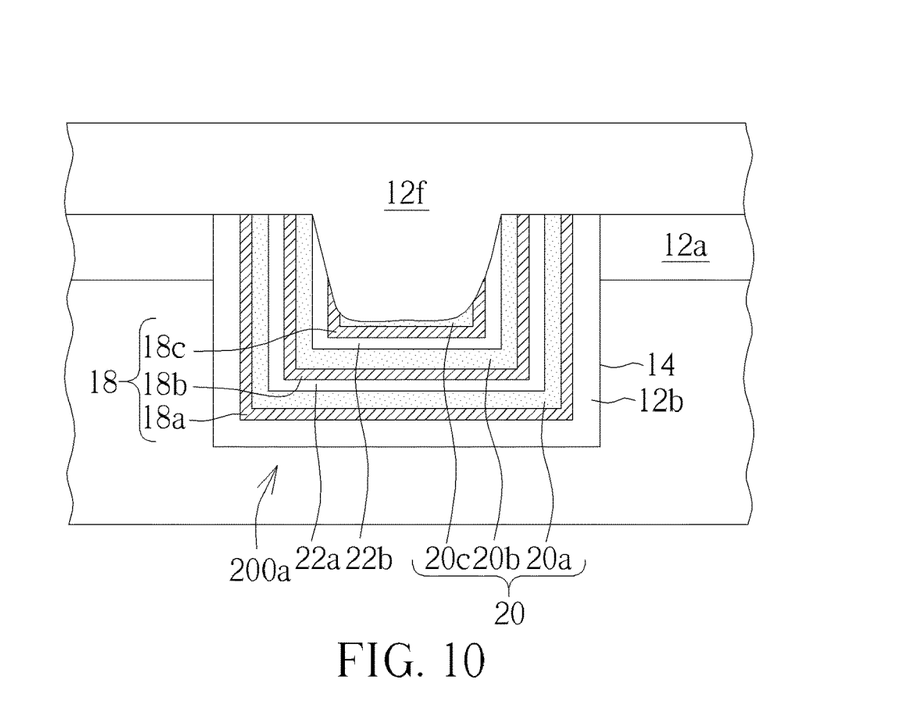

FIG. 9 to FIG. 10 schematically depict a fabricating method of a capacitor structure according to an example embodiment of the present invention, wherein elements in FIG. 9 and FIG. 10 which are substantially the same as those in the first preferred embodiment are denoted by the same reference numerals; an accompanying explanation is therefore omitted. As shown in FIG. 9, after forming the third electrode layer 20c, the center of the trench 14 is not filled up yet. Later, a planarization process 24 is performed to remove the dielectric layer 12b, the barriers 18a/18b/18c, the first electrode layer 20a, the second electrode layer 20b, the third electrode layer 20c and the capacitor dielectric layers 22a/22b. Because the center of the trench 14 is not filled up, the slurry used in the planarization process 24 not only remove the dielectric layer 12b, the barriers 18a/18b/18c, the first electrode layer 20a, the second electrode layer 20b, the third electrode layer 20c and the capacitor dielectric layers 22a/22b above the trench 14 in the lateral direction, but also contacts part of the materials in the trench 14. In this way, part of the material in the trench 14 is also removed by the planarization process 24. For example, the third electrode layer 20c, the barrier 18c, the capacitor dielectric layer 22b are partly removed during the planarization process 24. Under this circumstance, the capacitor structure 200a is damaged. As shown in FIG. 10, a dielectric layer 12f fills in the center of the trench 14. Next, conductive plugs and conductive layers can be formed in the dielectric layer 12f to electrically connect the capacitor structure 200a.

Figure 11:
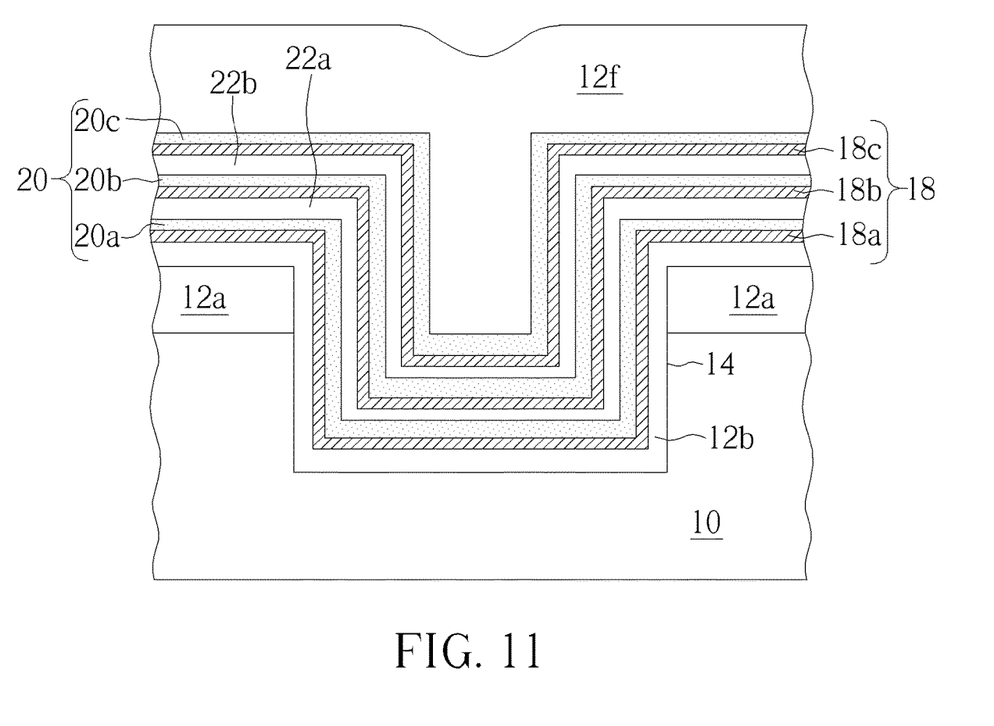
FIG. 11 schematically depicts a fabricating method of a capacitor structure according to another example embodiment of the present invention.

FIG. 11 schematically depicts a fabricating method of a capacitor structure according to another example embodiment of the present invention, wherein elements in FIG. 11 which are substantially the same as those in the first preferred embodiment are denoted by the same reference numerals; an accompanying explanation is therefore omitted. As shown in FIG. 11, after forming the third electrode layer 20c, the center of the trench 14 is not filled up. After that, a dielectric layer 12f is formed to fill up the center of the trench 14. Then, the dielectric layer 12f, the dielectric layer 12b, the barriers 18a/18b/18c, the first electrode layer 20a, the second electrode layer 20b, the third electrode layer 20c and the capacitor dielectric layers 22a/22b outside of the trench 14 need to be removed. However the dielectric layer 12f is formed of silicon oxide, silicon nitride, borophosphosilicate glass (BPSG) or other dielectric materials. These material formed the dielectric layer 12f have different property from that of the barriers 18a/18b/18c, the first electrode layer 20a, the second electrode layer 20b and the third electrode layer 20c. Therefore, a planarization process is performed first to remove part of the dielectric layer 12f by taking the third electrode layer 20c as a stop layer. Later, another planarization process is performed to remove the dielectric layer 12f, the dielectric layer 12b, the barriers 18a/18b/18c, the first electrode layer 20a, the second electrode layer 20b, the third electrode layer 20c and the capacitor dielectric layers 22a/22b outside of the trench 14. Later, steps illustrated in FIG. 4 are performed to form dielectric layers 12/c/12d/12e. Next, conductive plugs, conductive layers can be formed to electrically connect the capacitor structure. However, comparing to the first preferred embodiment, the method in this example embodiment has an extra step (a planarization process for the dielectric layer 12f) which increases the steps in the fabricating process.

A parallel-connected capacitor structure fabricated by the method illustrated in the first embodiment is shown in FIG. 5. As shown in FIG. 5, a parallel-connected capacitor structure 100a includes a substrate 10. A trench 14 is embedded in the substrate 10. An entirety of a sidewall of the trench 14 is perpendicular to a top surface of the substrate 10. Numerous electrode layers 20 respectively conformally fill in and cover the trench 14. The electrode layers 20 are formed of a plurality of nth electrode layers, wherein n is a positive integer starts from 1, 2, 3 . . . to M, M is not less than 3. The nth electrode layer with smaller n is closer to the sidewall of the trench 14. When n equals to M, an Mth electrode layer fills in a center of the trench 14, and a top surface of the Mth electrode layer is aligned with the top surface of the substrate 10.

FIG. 5 takes M equaling to 3 as an example. That is, a first electrode layer 20a, a second electrode layer 20b and a third electrode layer 20c are disposed in the trench 14. The first electrode layer 20a is closer to the sidewall of the trench 14. The third electrode layer 20c is farther from the sidewall of the trench 14. As shown in FIG. 3A, the third electrode layer 20c fills up the center of the trench 14.

Please still refer to FIG. 5. The substrate 10 may be a silicon substrate, a germanium substrate, a gallium arsenide substrate, a silicon germanium substrate, an indium phosphide substrate, a gallium nitride substrate, a silicon carbide substrate, a silicon on insulator (SOI) substrate, a dielectric substrate or an integrated passive device (IPD) wafer. In the FIG. 5, the substrate 10 takes the silicon substrate as an example. The dielectric layer 12b is used to isolate the substrate 10 and a parallel-connected capacitor structure 100b. If the substrate 10 is a dielectric substrate, the dielectric layer 12b can be omitted. Moreover, the capacitor dielectric layer 22a is disposed between the first electrode layer 20a and the second electrode layer 20b. The capacitor dielectric layer 22b is disposed between the second electrode layer 20b and the third electrode layer 20c.

Moreover, a barrier 18a is disposed between the first electrode layer 20a and the substrate 10. There is also a barrier between the nth electrode layer and the capacitor dielectric layer. For example, a barrier 18b is disposed between the second electrode layer 20b and the capacitor dielectric layer 22a. A barrier 18c is disposed between the third electrode layer 20c and the capacitor dielectric layer 22c. The barriers 18a/18b/18c can respectively be tantalum nitride or titanium nitride. The capacitor dielectric layers 22a/22b respectively includes silicon nitride, silicon oxide, zirconium oxide, hafnium oxide, aluminum oxide or a combination thereof. The first electrode layer 20a, the second electrode layer 20b and the third electrode layer 20c can respectively include copper, tungsten, tantalum or Cu—Al alloy. Please refer to FIG. 3, in the case of M equals to 3, the barriers 18a/18b/18c, the first electrode layer 20a, the second electrode layer 20b, the third electrode layer 20c and the capacitor dielectric layers 22a/22b form a capacitor structure 100a.

Please refer to FIG. 5, a first conductive plug 26a contacts the nth electrode layer with odd-numbered n. For example, two first conductive plugs 26a respectively contact first electrode layer 20a and the third electrode layer 20c. The second conductive plug 26b contacts the nth electrode layer with even-numbered n. For example, a second conductive plug 26b contacts the second electrode layer 20b. All of the first conductive plugs 26a contact the first conductive layer 28a. The second conductive plug 26b contacts the second conductive layer 28b. The first conductive layer 28a electrically connects the first conductive terminal 30a. The second conductive layer 28b contacts the second conductive terminal 30b. The first conductive terminal 30a and the second conductive terminal 30b further electrically connect to other signal input/output devices.

Figure 6:
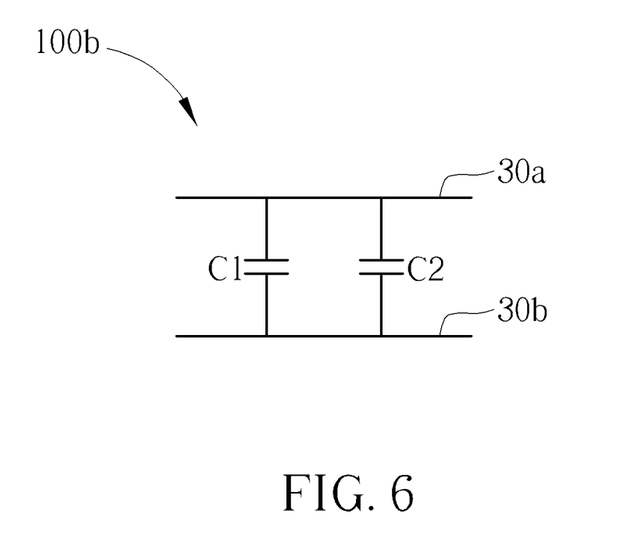
FIG. 6 depicts an equivalent circuit diagram of a parallel-connected capacitor structure in FIG. 5.

FIG. 6 depicts an equivalent circuit diagram of a parallel-connected capacitor structure in FIG. 5. Please refer to FIG. 5 and FIG. 6. A parallel-connected capacitor structure 100b is achieved by applying the first conductive plugs 26a, the second conductive plug 26b, the first conductive layer 28a and the second conductive layer 28b to the capacitor structure 100a. A first capacitor C1 is formed between the first electrode layer 20a and the second electrode layer 20b. A capacitor C2 is formed between the second electrode layer 20b and the third electrode layer 20c. The top electrodes of the first capacitor C1 and the second capacitor C2 are electrically connects to the first conductive terminal 30a. The bottom electrodes of the first capacitor C1 and the second capacitor C2 are electrically connects to the second conductive terminal 30b. Therefore, the first capacitor C1 and the second capacitor C2 form the parallel-connected capacitor structure 100b.

Figure 7:
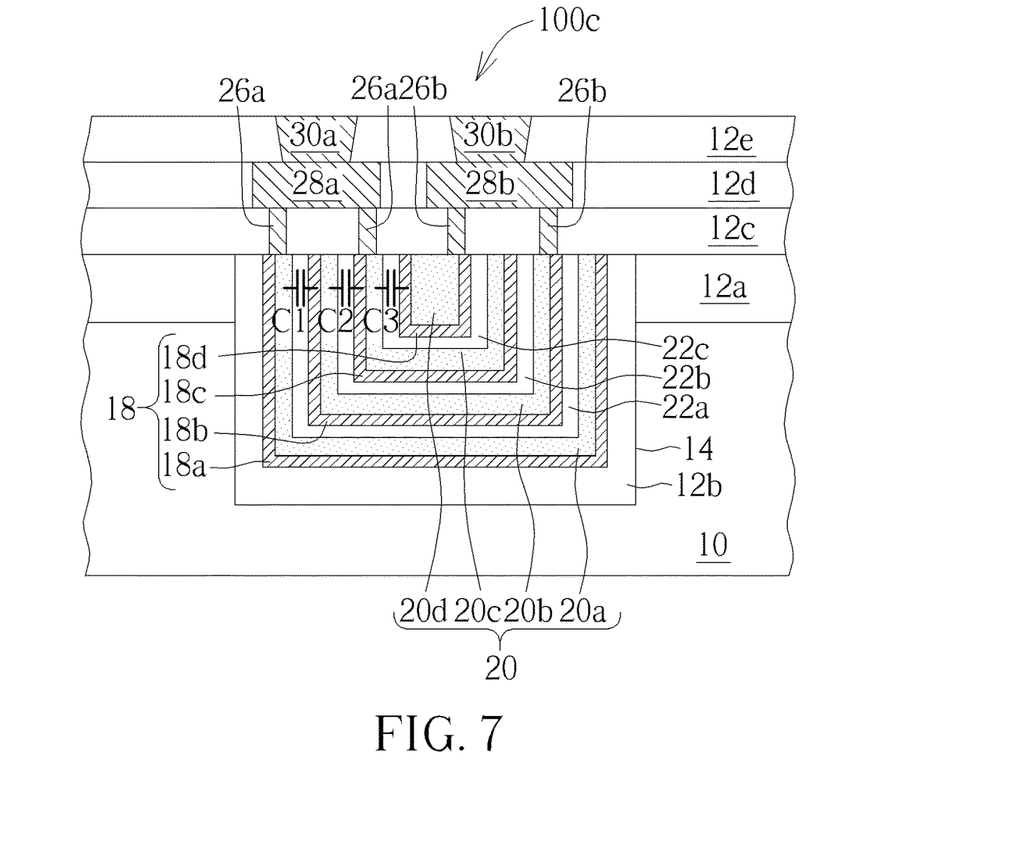
FIG. 7 depicts a parallel-connected capacitor structure according to a second preferred embodiment of the present invention.
Figure 8:
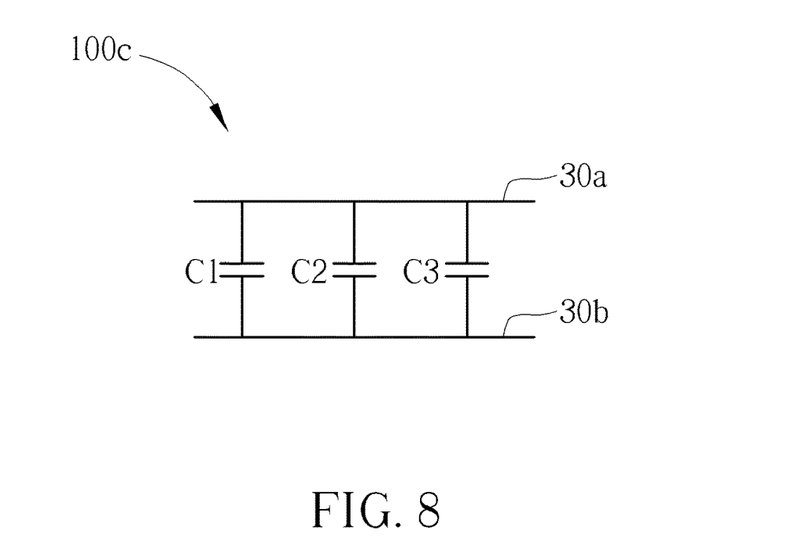
FIG. 8 depicts an equivalent circuit diagram of a parallel-connected capacitor structure in FIG. 7.

FIG. 7 depicts a parallel-connected capacitor structure according to a second preferred embodiment of the present invention, wherein elements in FIG. 7 which are substantially the same as those in the first preferred embodiment are denoted by the same reference numerals; an accompanying explanation is therefore omitted. FIG. 8 depicts an equivalent circuit diagram of a parallel-connected capacitor structure in FIG. 7.

As mentioned above, n is a positive integer starts from 1 to M, and M is not less than 3. Besides the case of M equaling 3 in the first preferred embodiment, M can be greater than 3 based on different product requirements. The embodiment in FIG. 7 shows the case that M equals 4. The differences between the parallel-connected capacitor structure in FIG. 7 and the parallel-connected capacitor structure in FIG. 5 is that there are four electrode layers in FIG. 7. Moreover, a fourth electrode layer 20d is disposed at the center of the trench 14. Two second conductive plugs 26b respectively contact the second electrode layer 20b and the fourth electrode layer 20d. A capacitor dielectric layer 22c is disposed between the third electrode layer 20c and the fourth electrode layer 20d. A barrier 18d is disposed between the fourth electrode layer 20d and the capacitor dielectric layer 22c.

As shown in FIG. 8, a first capacitor C1 is formed between the first electrode layer 20a and the second electrode layer 20b. A capacitor C2 is formed between the second electrode layer 20b and the third electrode layer 20c. A third capacitor C3 is disposed between the third electrode layer 20c and the fourth electrode layer 20d. The top electrodes of the first capacitor C1, the second capacitor C2 and the third capacitor C3 are electrically connects to the first conductive terminal 30a. The bottom electrodes of the first capacitor C1, the second capacitor C2 and the third capacitor C3 are electrically connects to the second conductive terminal 30b. Therefore, the first capacitor C1, the second capacitor C2 and the third capacitor C3 form the parallel-connected capacitor structure 100c.

The parallel-connected capacitor structure of the present invention is formed in the trench with small aspect ratio. The small aspect ratio of the trench makes the dry etching much easier. Although the aspect ratio is small, numerous parallel-connected capacitors can be disposed in one trench. In this way, a total number of capacitors in unit area is increased. Moreover, the capacitance density is also raised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A parallel-connected capacitor structure, comprising:
a substrate;
a first dielectric layer contacting a top surface of the substrate, and wherein the first dielectric layer is only on the top surface of the substrate;
a trench embedded in the substrate, wherein an entirety of a sidewall of the trench is perpendicular to the top surface of the substrate;
a dielectric layer contacting a bottom and the sidewall of the trench;
a plurality of electrode layers respectively conformally filling in and covering the trench, wherein the plurality of electrode layers are formed of a plurality of nth electrode layers, n is a positive integer from 1 to M, M is not less than 3, the nth electrode layer with smaller n is closer to the sidewall of the trench, when n equals to M, an Mth electrode layer fills in a center of the trench, a top surface of each of the plurality of electrode layers is aligned with the top surface of the first dielectric layer, and the plurality of electrode layers are independently formed by material selected from a group consisting of copper, tungsten, tantalum and Cu—Al alloy;
a capacitor dielectric layer disposed between the plurality of electrode layers adjacent to each other, wherein a sidewall of the capacitor dielectric layer contacts one of the plurality of electrode layers;
a first conductive plug contacting the nth electrode layer of the plurality of nth electrode layers with odd-numbered n; and
a second conductive plug contacting the nth electrode layer of the plurality of nth electrode layers with even-numbered n, wherein the first conductive plug and the second conductive plug are electrically connected to different conductive terminals.

2. The parallel-connected capacitor structure of claim 1, further comprising a barrier disposed between a first electrode layer and the substrate when n=1, and wherein the barrier comprises tantalum nitride or titanium nitride.

3. The parallel-connected capacitor structure of claim 1, further comprising a barrier disposed between one of the nth electrode layer of the plurality of nth electrode layers and the capacitor dielectric layer when n is not less than 2, and wherein the barrier comprises tantalum nitride or titanium nitride.

4. The parallel-connected capacitor structure of claim 1, wherein the plurality of the electrode layers are formed of copper.

5. The parallel-connected capacitor structure of claim 1, wherein the substrate is a semiconductor substrate.

6. The parallel-connected capacitor structure of claim 1, wherein an aspect ratio of the trench is between 2.5 and 30.

7. The parallel-connected capacitor structure of claim 1, wherein as seeing from a top view, the Mth electrode layer is a solid rectangle or a solid circle.

8. The parallel-connected capacitor structure of claim 1, wherein as seeing from a top view, the plurality of the electrode layers form concentric rectangles or concentric circles.

9. The parallel-connected capacitor structure of claim 1, wherein a part of the trench is within the substrate, and the other part of the trench is within the first dielectric layer.

\* \* \* \* \*